United States Patent [19]
Sim

[11] Patent Number: 5,610,861
[45] Date of Patent: Mar. 11, 1997

[54] FLASH MEMORY DEVICE

[75] Inventor: Hyun S. Sim, Kyungki-do, Rep. of Korea

[73] Assignee: Hyundai Electronics Industries Co., Ltd., Kyungki-do, Rep. of Korea

[21] Appl. No.: 576,055

[22] Filed: Dec. 21, 1995

[30] Foreign Application Priority Data

Dec. 27, 1994 [KR] Rep. of Korea ............... 94-37294

[51] Int. Cl.$^6$ ............................................. G11C 29/00
[52] U.S. Cl. ........................... 365/185.24; 365/185.22; 365/201
[58] Field of Search ................. 365/185.24, 185.18, 365/185.22, 185.29, 185.3, 185.33, 200, 201

[56] References Cited

U.S. PATENT DOCUMENTS

| 4,779,272 | 10/1988 | Kohda et al. | 365/201 |
|---|---|---|---|
| 5,440,516 | 8/1995 | Slemmer | 365/201 |
| 5,491,665 | 2/1996 | Sachdeu | 365/201 |

FOREIGN PATENT DOCUMENTS 4-64996  2/1992  Japan.

*Primary Examiner*—Tan T. Nguyen
*Attorney, Agent, or Firm*—Fish & Richardson P.C.

[57] ABSTRACT

The present invention relates to a flash memory device, more particularly to a flash memory device which can shorten a pre-program time in a way that identifies the state of the pre-program and the program on a selected word line basis in a pre-program mode that must be pre-performed in a sector mode.

6 Claims, 2 Drawing Sheets

FLASH MEMORY DEVICE

FIELD OF THE INVENTION

The present invention relates to a flash memory device, and more particularly to a flash memory device which can verify the program state on a word line basis after it pre-programs the memory cells on a word line basis in a pre-program mode for erasing a chip.

BACKGROUND OF THE INVENTION

In general, the flash memory device comprising a stack memory cell has a drawback consuming a lot of time when verifying a pre-program and a program mode because it has to identify the pre-program and the program mode on a byte unit.

SUMMARY OF THE INVENTION

Accordingly, one purpose of the present invention is to provide a flash memory device that can overcome the above drawback in a way that identifies the pre-program and program state on a selected word line basis in a pre-program mode that is required to be pre-performed in a sector erasure mode.

Another purpose of the present invention is to provide a flash memory device which can shorten a test time.

To accomplish the above objects, a flash memory device according to the present invention, comprises: a plurality of bit lines; a plurality of word lines; a first switching means for switching a supply of drain voltage for programming and drain voltage for a reading-out based on a signal that is inputted via the each word line; a plurality of memory cells coupled between the each bit line and the first switching means, wherein the memory cells maintain the program state based on the signal that is inputted via the each word line; a second switching means coupled between the each bit line and a VSS terminal, wherein the second switching means switch a supply of the VSS power supply based on an enable signal for pre-programming; and a pre-program verification circuit for identifying the state of the program and the erasure based on each drain voltage of the memory cells that are coupled to the selected word line during a program identification operation.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the embodiments of the present invention will be described in detail with reference to the accompanying drawings.

Figure 1:
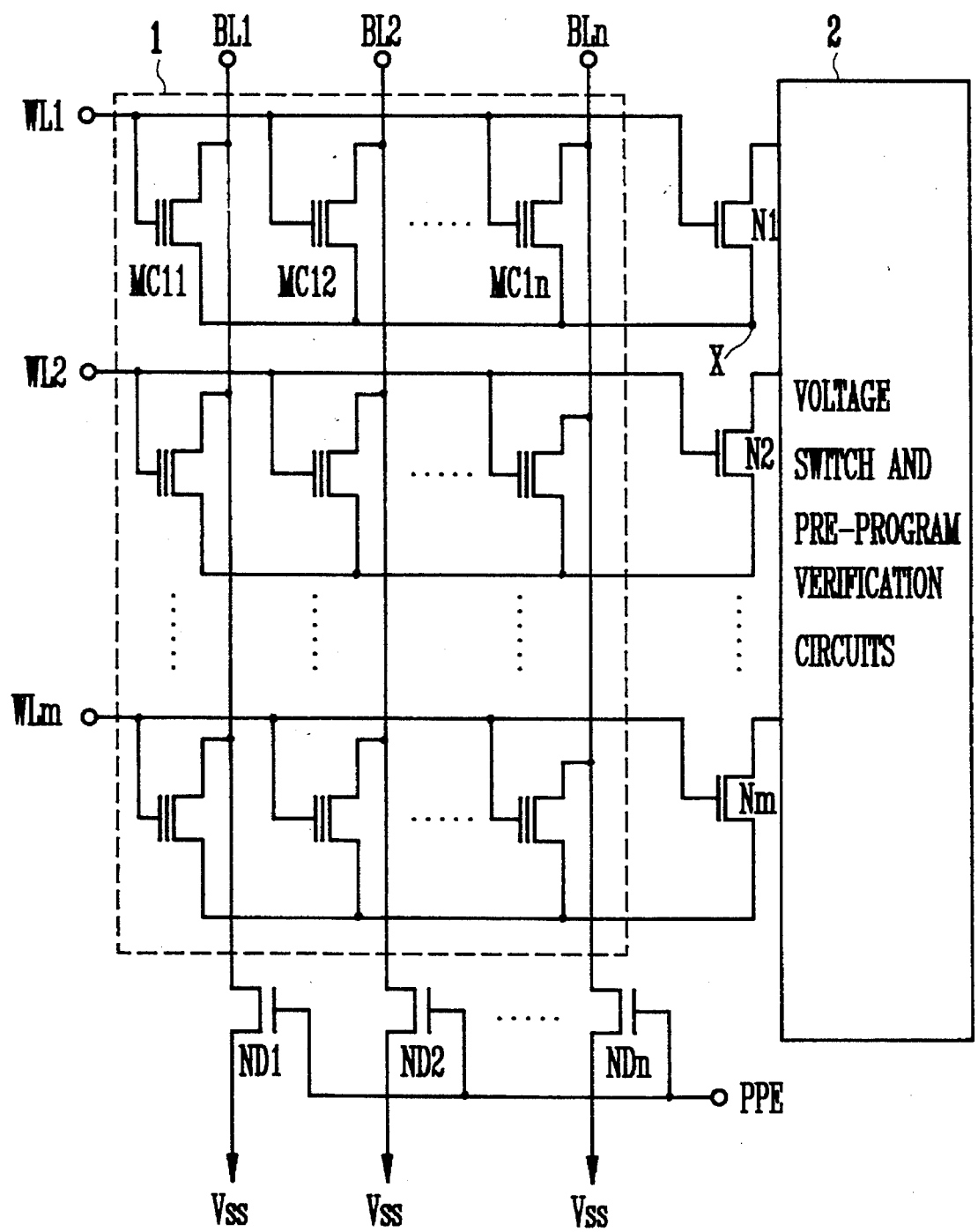
FIG. 1 shows a circuit of a flash memory device according to the first embodiment of the present invention.

FIG. 1 shows a circuit of a :flash memory device according to the first embodiment of the present invention, and the operations thereof are will be explained below.

In a flash memory device comprising NMOS transistors ND1,ND2, . . . NDn of a second switching means which are coupled between a group of memory cells 1 and a VSS terminal and are inputs to a pre-program enable signal (PPE), and NMOS transistors N1,N2, . . . Nm of a first switching means which are coupled between the group of memory cells 1 and a voltage switch and pre-program verification circuits 2 and are inputs to the signal via word lines WL1,WL2, . . . WLn, if the enable signal PPE for pre-programming is enabled, the NMOS transistors ND1, ND2, . . . NDn are turned on and then the power supply from the VSS terminal is applied to each bit line BL1,BL2, . . . BLn. Then if we assume that the word line WL1 is selected, a gate voltage $V_{PG}$ for programming is applied to each gate electrode of the memory cells MCl1, MCl2, . . . , MCln via the selected word line WL1. As NMOS transistors N2, . . . Nm are turned off while the NMOS transistor N1 is turned on based on the signal inputted into the word line WL1, a drain voltage $V_{PD}$ for programming is applied into the drain electrode of the memory cells MCl1, MCl2, . . . , MCln from the voltage switch and pre-program verification circuits 2. Therefore, all the memory cells MCl1,MCl2, . . . MCln in the selected word line WL1 are pre-programed at the same time.

On the one hand, the verification operation for the pre-program will be explained. As the NMOS transistors ND1, ND2, . . . NDn are turned on by means of the pre-program enable signal PPE, the power supply from the VSS terminal is applied to each bit line BL1,BL2, . . . BLn. Then if we assume that the word line WL1 is selected, a gate voltage $V_{RG}$ for reading-out operation is applied to the gate electrode of the memory cells MCl1,MCl2, . . . MCln via the selected word line WL1. As the NMOS transistor N1 is turned on based on the signal inputted into the selected word line WL1, a drain voltage $V_{RD}$ for reading-out operation is applied to the drain terminal of the memory cells MCl1, MCl2, . . . , MCln from the voltage switch and pre-program verification circuits 2. Therefore, it verifies the program state on each word line basis. Then, for example, if all the memory cells in the selected word line WL1 are in a pre-programed state, the voltage level in the node x becomes a High state, and so next word lines are pre-programed. If at least one memory cell of the memory cells in the selected word line is not in a pre-programed state, the voltage level in the node x becomes a Low state and then it is pre-programed again, As a result, every memory cells in the sectors are pre-programed.

Figure 2:
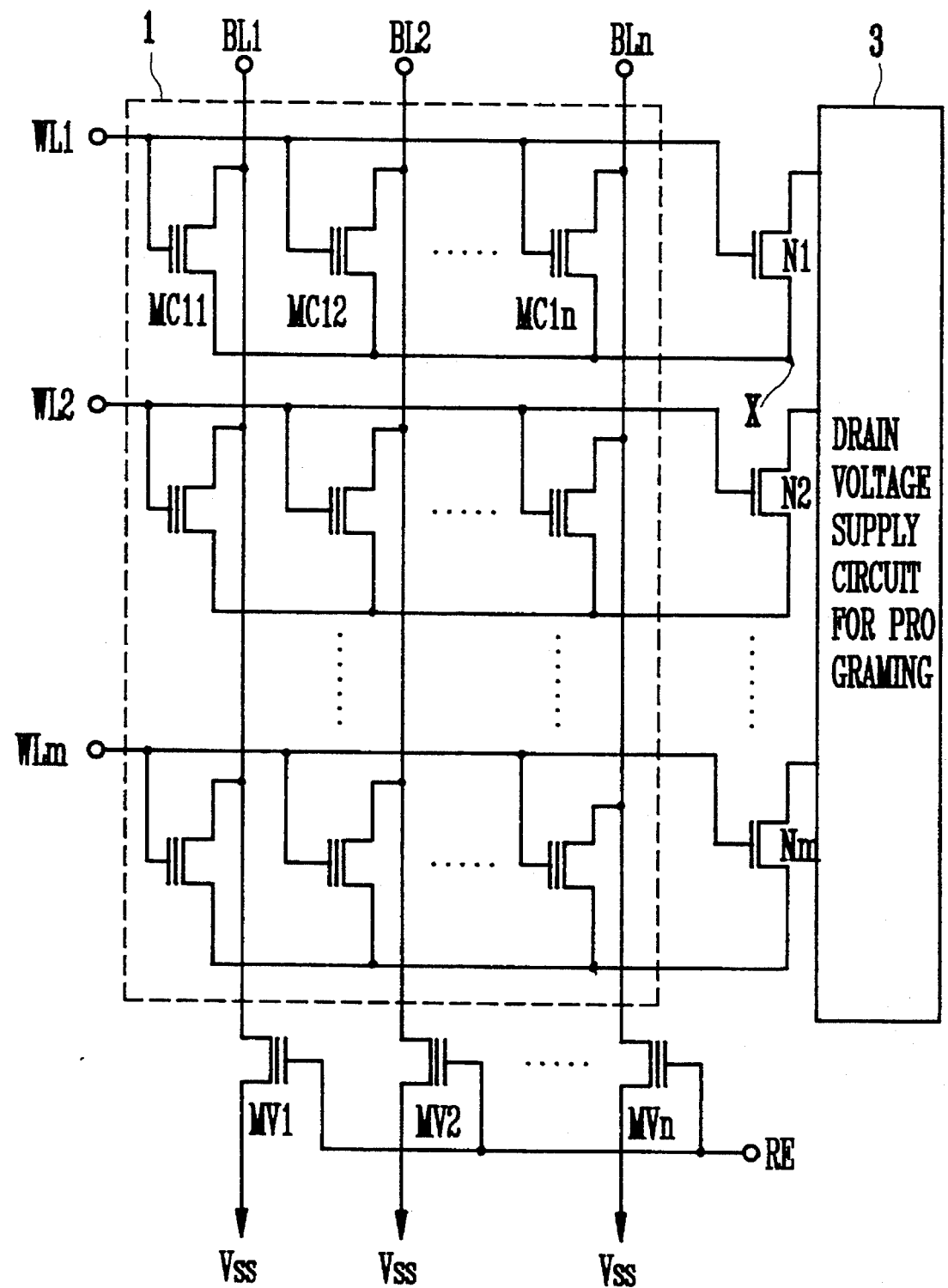
FIG. 2 shows a circuit of a flash memory device according to the second embodiment of the present invention.

FIG. 2 shows a circuit of a flash memory device according to the second embodiment of the present invention.

The flash memory device of the present invention comprises virgin memory cells MV1 to MVn of a second switching means which are coupled between the group of memory cells 21 and the VSS terminal and are inputs to a read-out enable signal RE and NMOS transistors N1 to Nm of a first switching means which are coupled between the group of memory cells 1 and a drain voltage supply circuit 3 for a programming and are inputs to the signal via the word lines WL1 to WNn. If we assume that the word line WL1 is selected and the read-out enable signal RE becomes a "HIGH" state, a gate voltage $V_{PG}$ for programming is applied to the memory cells MCl1,MCl2, . . . MCln and the gate electrode of the transistor N1 via the selected word line WL1. Therefore, as the voltage $V_{PD}$ from the drain voltage supply circuit 3 is applied to the memory cells MCl1,MCl2, . . . , MCln via the transistor N1, the programming is performed on a word line basis.

If we assume that word line WL1 is selected during a program verification operation, a gate voltage $V_{RG}$ for reading-out is applied to the memory cells MCl1,MC12, . . . , MCln and the gate electrode of the transistor N1 via the word line WL. For example, if the memory cells MCl1 and MCln are normally programed, the voltage level in the bit lines BL1 and BL2 becomes a "LOW" state because the current flowing through the memory cells MCl1 and MCl2 is small. However, if the memory cells MCln are not sufficiently programed, the voltage level in the bit line BLn become a "HIGH" state because the current flowing through the memory cells MCln is larger than the current flowing through the virgin memory cells MVn. Accordingly, the present invention can verify the state of the program and the erasure for the memory cells on a word line basis in a way that verifies the voltage level in the bit lines BL1,BL2, . . . , BLn. Though it is not shown in FIG. 2, the voltage level in the bit lines BL1,BL2, . . . , BLn can be confirmed by means of the pre-program verification circuit.

As described above, the present invention has an outstanding effect that can not only shorten the programing time but also prevent an over-programming in a way that verifies the program state after it pre-programs the memory cells on a word line basis in a pre-program mode that must be pre-executed in a sector erasure mode.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. A flash memory device, comprising:

a plurality of bit lines;

a plurality of word lines;

a first switching means for switching a supply of drain voltage for programming and drain voltage for a reading-out based on a signal that is inputted via said each word line;

a plurality of memory cells coupled between said each bit line and said first switching means, wherein said memory cells maintain the program state based on the signal that is inputted via said each word line;

a second switching means coupled between said each bit line and a VSS terminal, wherein said second switching means switch a supply of the VSS power supply based on an enable signal for pre-programing; and a pre-program verification circuit, coupled to said first switching means, for identifying the state of the program and the erasure based on each drain voltage of the memory cells that are coupled to the selected word line during a program identification operation.

2. A flash memory device set forth in claim 1, wherein said first switching means comprises a plurality of NMOS transistors.

3. A flash memory device set forth in claim 1, wherein said second switching means comprises a plurality of NMOS transistors.

4. A flash memory device, comprising:

a plurality of bit lines;

a plurality of word lines;

a first switching means for switching a supply of drain voltage for a programming and drain voltage for reading-out operation based on the signal that is inputted via said each word line;

a plurality of memory cells coupled between said each bit line and said first switching means, for maintaining the program state based on the signal that is inputted via said each word line, a second switching means coupled between said each bit line and a VSS terminal, for switching a supply of the VSS power supply based on a read-out enable signal; and a pre-program verification circuit, coupled to said first switching means, for identifying the state of the program and the erasure for the memory cells which are coupled to the selected word line based on each voltage level in said bit line during a program identification operation.

5. A flash memory device set forth in claim 4, wherein said first switching means comprises a plurality of NMOS transistors.

6. A flash memory device set forth in claim 4, wherein said second switching means comprises a plurality of virgin memory cells.

* * * * *